(12) United States Patent
Rafi

(10) Patent No.: US 9,948,313 B1
(45) Date of Patent: Apr. 17, 2018

(54) MAGNETICALLY DIFFERENTIAL LOOP FILTER CAPACITOR ELEMENTS AND METHODS RELATED TO SAME

(71) Applicant: Silicon Laboratories Inc., Austin, TX (US)

(72) Inventor: Aslamali A. Rafi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/383,483

(22) Filed: Dec. 19, 2016

(51) Int. Cl.
| H01G 4/008 | (2006.01) |
| H03L 7/099 | (2006.01) |
| H03L 7/085 | (2006.01) |
| H01L 49/02 | (2006.01) |

(52) U.S. Cl.
CPC ............ H03L 7/099 (2013.01); H01L 28/60 (2013.01); H03L 7/085 (2013.01)

(58) Field of Classification Search
CPC ..................................................... H03L 7/099
See application file for complete search history.

(56) References Cited

U.S. PATENT DOCUMENTS

| 7,485,912 | B2* | 2/2009 | Wang ..................... H01G 4/005 257/306 |
| 2009/0245440 | A1 | 10/2009 | Vancorenland et al. |
| 2011/0215848 | A1 | 9/2011 | Koroglu et al. |

OTHER PUBLICATIONS

Rafi et al. "Apparatus for Low power Signal Generator and Associated Methods", U.S. Appl. No. 15/179,847, filed Jun. 10, 2016, 43 pgs.
Ahola et al., "A Single-Chip CMOS Transceiver for 802.11a/b/g Wireless LANs", IEEE Journal of Soli d State Circuits, vol. 39, No. 12, Dec. 2004, 9 pgs.
Detcheverry et al., "The Effect of Copper Design Rules on Inductor Performance", IEEE, 2003, 4 pgs.
Zhang et al., "Design of Components and Circuits Underneath Integrated Inductors", IEEE Journal of Solid State Circuits, vol. 41, No. 10, Oct. 2006, 7 pgs.
Kuhn et al., "Spiral Inductor Performance in Depp Submicron Bulk CMOS With Copper Interconnects", IEEE Radio Frequency Integrated Circuits Symposium, 2002, 4 pgs.
Chen, "Effects of CMOS Process Fill Patterns on Spiral Inductors", Microwave and Optical Technology Letters, vol. 36, No. 6, Mar. 2003, 4 pgs.

* cited by examiner

Primary Examiner — Daniel Puentes
(74) Attorney, Agent, or Firm — Egan Peterman Enders Huston

(57) ABSTRACT

Apparatus and methods are disclosed that utilize magnetically differential loop filter capacitor elements that are physically positioned adjacent voltage-controlled oscillator (VCO) inductor/s in the device layout of a phase locked loop (PLL) circuit. Such a PLL circuit may be employed, for example, to produce a PLL output signal for RF receivers, RF transmitters, RF transceivers and any other type of circuit configured to utilize a PLL output signal having a phase that is based on the phase of an input signal.

24 Claims, 10 Drawing Sheets

US 9,948,313 B1

MAGNETICALLY DIFFERENTIAL LOOP FILTER CAPACITOR ELEMENTS AND METHODS RELATED TO SAME

FIELD

The disclosed apparatus and methods relate to loop filter circuitry and, more particularly, to loop filter capacitor elements.

BACKGROUND

Frequency synthesizers are building block circuits in modern integrated transceivers. In order to meet phase noise requirements while consuming less power, inductance-capacitance voltage-controlled oscillators (LC-VCOs) are employed in frequency synthesizers. The inductance (L) in an LC-VCO circuit comes into existence when a current is made to flow through an inductor wire that encloses an area. To achieve inductance values having the high quality factors typically needed for modern transceivers, a significant silicon area is utilized. Other circuitry placed in the area enclosed by the inductor, causes degradation in the quality factor of the inductor because of eddy losses and consequently degrades the phase noise performance of the frequency synthesizer.

In copper based semiconductor manufacturing processes, a minimum density of metals for chemical mechanical processing (CMP) is needed in all layers, including the area enclosed by a frequency synthesizer inductor. Small pieces of metal are placed as a "density fill" within the enclosed inductor area to fulfill this minimum density requirement. These pieces of metal are small to reduce eddy losses and have no use other than meeting the metal density requirement for processing.

SUMMARY

Disclosed herein are apparatus and methods that utilize loop filter capacitor elements that may be physically positioned adjacent LC-VCO inductor/s in the device layout of a phase locked loop (PLL) circuit. Such a PLL circuit may be employed, for example, to produce a PLL output signal for RF receivers, RF transmitters, RF transceivers and any other type of circuit configured to utilize a PLL output signal having a phase that is based on the phase of an input signal. Specific examples of circuit applications for PLL output signals include, but are not limited to, local oscillator (LO) up-conversion during RF transmission and down-conversion during RF reception. One or more of the loop filter capacitor elements of such a PLL circuit may each be configured as a magnetically differential capacitor circuit that creates multiple component magnetic fields of opposite directions such that the resulting composite magnetic field at any point in space is a superposition of the opposing component magnetic fields, and is consequently lesser in magnetic strength than are the component magnetic fields alone. Also, by reciprocity such a magnetically differential capacitor circuit is less susceptible to external magnetic fields than a non-magnetically differential capacitor circuit of otherwise similar layout.

In one embodiment, an integrated circuit device may be provided in which the metal structure of an integrating capacitor of a PLL loop filter may be split into relatively smaller capacitor units or elements that are electrically coupled together and configured in a magnetically differential pattern that is at least partially positioned within a device area that is enclosed by at least one LC-VCO inductor structure that may include one or more inductor elements. In one exemplary embodiment, this loop filter capacitor configuration may be implemented to fulfill the semiconductor processing metal density requirement in the otherwise empty device area enclosed by the inductor structure, while at the same time providing useful loop filter capacitor circuitry elements in the silicon real estate of this enclosed device area that is left unused and wasted in PLL circuitry of conventional integrated circuitry devices. In a further exemplary embodiment, the magnetically differential loop filter capacitor elements may be positioned to partially or completely replace the metal piece "density fill" that is conventionally placed within the device area enclosed by a LC-VCO inductor structure.

In the practice of the disclosed apparatus and methods, magnetically differential placement of the loop filter capacitor elements within the device area enclosed by the LC-VCO inductor may be implemented to reduce interaction between the magnetic fields of the inductors and those arising from the current through the loop filter capacitor of the PLL, thus reducing spurious coupling. In a further embodiment, no loop filter capacitor circuitry may be placed directly above or below LC-VCO inductor metal so as to prevent degradation in self resonant frequency of the inductor in a VCO, e.g., which in one embodiment may be a high frequency VCO (e.g., frequency greater than about 2 GHz). In this way, the disclosed systems and methods may be implemented to provide a loop filter capacitor for a PLL of an integrated circuit device in a manner that is configured to save silicon area of the integrated circuit device as compared to conventional integrated PLL circuitry and without incurring a performance penalty to operation of the PLL.

In one exemplary embodiment, multiple magnetically differential loop filter capacitor elements of an integrated PLL circuit may be implemented as metal finger capacitors that have relatively small current eddy losses. In such an exemplary embodiment, a relatively larger PLL loop filter capacitor structure may be split into multiple relatively smaller metal-oxide-metal (MoM) finger capacitor elements (e.g., 3 micron by 3 micron or other suitable size) that are placed partially or completely inside the device area enclosed by a LC-VCO inductor structure. Such finger capacitor elements may have any suitable combination of geometry and size that is suitable for placement within the device area that is enclosed by an LC-VCO inductor. Examples of suitable shapes for the metal finger capacitor elements include, but are not limited to, triangular-shaped, square-shaped, rectangular-shaped, circular or oval shaped, irregular-shaped, etc. In one exemplary embodiment, MoM capacitor elements may be laid out and fabricated so that ground/signal loops are avoided in the layout of the MoM caps to minimize eddy losses. In yet a further exemplary embodiment, capacitance to the raw substrate of the integrated circuit may be minimized by placing the capacitor in a grounded enclosure.

In one respect, disclosed herein is an apparatus having semiconductor device circuitry including: at least one loop filter coupled to provide a control signal based on the frequency of an input signal, the loop filter including at least one capacitor coupled between the control signal and ground of the circuitry; and a voltage controlled oscillator (VCO) including at least one inductor loop, the VCO being coupled to receive the control signal and to provide an output signal having a frequency that is a function of the control signal received from the loop filter. The loop filter capacitor may include at least one capacitor element that includes spaced capacitor electrodes configured as a magnetically differential capacitor circuit.

In another respect, disclosed herein is a semiconductor circuit device, including: a semiconductor substrate; at least one capacitor element formed in one or more conductive layers on the semiconductor substrate, each of the conducive layers being separated from any other conductive layers by a layer of dielectric material, and the capacitor element including spaced capacitor electrodes configured in the conductive layers as a magnetically differential capacitor circuit; and at least one conductive inductor loop formed in a different conductive layer on the semiconductor substrate that is separated from the conductive layers of the capacitor element by a layer of dielectric material, the inductor loop enclosing a device area of the semiconductor device. At least a portion of the capacitor element may be positioned within the device area enclosed by the inductor loop.

In another respect, disclosed herein is a method, including: using at least one loop filter to provide a control signal based on the frequency of an input signal, the loop filter including at least one loop filter capacitor coupled between the control signal and ground of the circuitry; and using a voltage controlled oscillator (VCO) to receive the control signal and to provide an output signal having a frequency that is a function of the control signal received from the loop filter. The loop filter capacitor may include at least one capacitor element that includes spaced capacitor electrodes configured as a magnetically differential capacitor circuit.

DESCRIPTION OF ILLUSTRATIVE EMBODIMENTS

Figure 1:
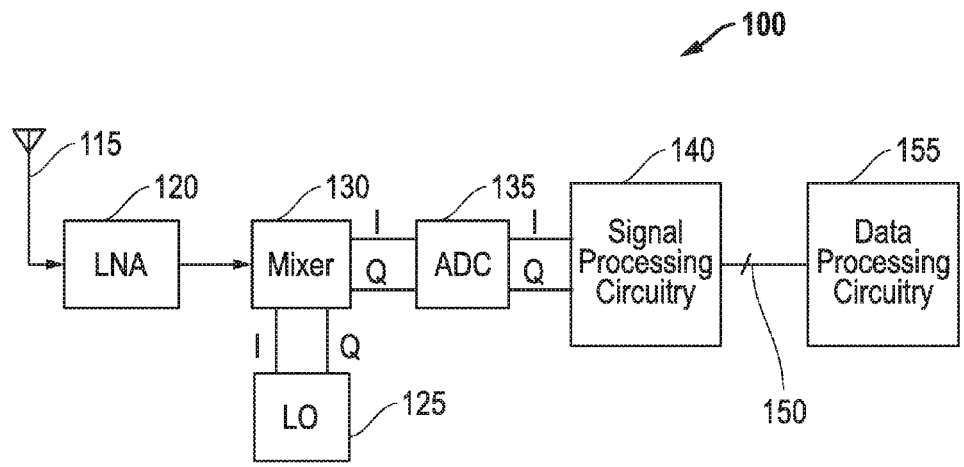
FIG. 1 illustrates a simplified block diagram of a RF receiver circuit arrangement according to one exemplary embodiment of the disclosed apparatus and methods.
Figure 2:
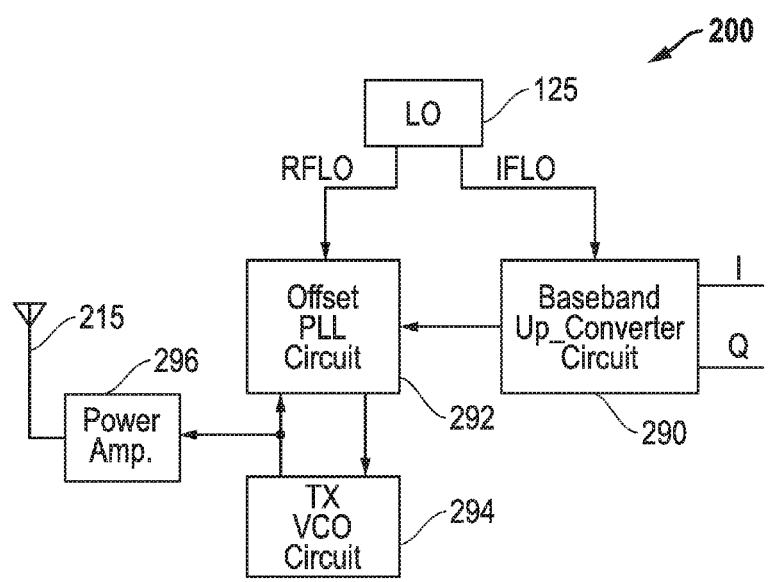
FIG. 2 illustrates a simplified block diagram of a RF transmitter circuit arrangement according to one exemplary embodiment of the disclosed apparatus and methods.
Figure 3:
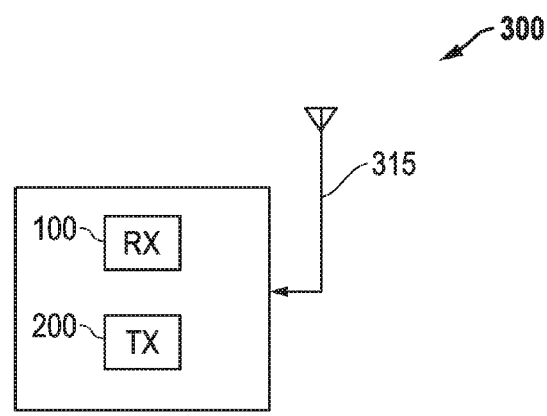
FIG. 3 illustrates a simplified block diagram of a RF transmitter circuit arrangement according to one exemplary embodiment of the disclosed apparatus and methods.

FIGS. 1-3 illustrate exemplary embodiments of radio frequency (RF) apparatus having circuit architectures that include phase locked loop (PLL) circuitry that employs magnetically differential loop filter capacitor elements that are physically positioned adjacent LC-VCO inductor/s in the device layout of the PLL. It will be understood that the illustrated embodiments of FIGS. 1-3 are exemplary only and that the disclosed PLL circuitry may be employed to generate an output signal having a phase related to the phase of an input signal provided to the PLL.

FIG. 1 illustrates a circuit arrangement for a RF receiver 100 that may employ a PLL circuit configured as a local oscillator (LO) 125 according to one exemplary embodiment of the disclosed apparatus and methods. As shown, receiver 100 receives RF signals via antenna 115. The RF signals feed an input of low noise amplifier (LNA) 120. LNA 120 provides low-noise amplification of the RF signals, and provides amplified RF signals to mixer 130. Mixer 130 performs frequency translation or shifting of the RF signals, using a reference or LO frequency provided by LO 125. For example, in one embodiment, mixer 130 may translate the RF signal frequencies to baseband frequencies. In another exemplary embodiment, mixer 130 may translate the RF signal frequencies to an intermediate frequency (IF). In the illustrated embodiment, LO 125 provides two reference signals, with a quadrature relationship, to mixer 130. More specifically, LO 125 provides an in-phase (I) signal I and a quadrature (Q) signal Q to mixer 130. Signals I and Q have a quadrature relationship, i.e., they are out of phase with respect to each other by 90° or 2p radians.

In the embodiment of FIG. 1, mixer 130 provides the translated output signal as a set of two signals, I and Q. The I and Q signals are analog time-domain signals. Analog to digital converter (ADC) 135 converts the I and Q signals to digital I and Q signals. In exemplary embodiments, ADC 135 may use a variety of signal conversion techniques. For example, in some embodiments, ADC 135 may use delta-sigma (or sometimes called sigma-delta) analog to digital conversion. ADC 135 provides the digital I and Q signals to signal processing circuitry 140. Signal processing circuitry 140 may in turn be configured to perform processing on the digital I and Q signals, e.g., such as digital signal processing (DSP). In this regard, signal processing circuitry 140 may be configured to perform a variety of signal processing functions, such as demodulation, to retrieve or extract information, such as data signals, that were modulated (e.g., in a transmitter (not shown)), and provided to antenna 115 as RF signals.

Still referring to FIG. 1, signal processing circuitry 140 provides information, such as the demodulated data, to data processing circuitry 155 via link 150. Data processing circuitry 155 may be configured to perform a variety of functions (e.g., logic, arithmetic, etc.). For example, data processing circuitry 155 may use the demodulated data in a program, routine, or algorithm (whether in software, firmware, hardware, or a combination) to perform desired control or data processing tasks. In some embodiments, data processing circuitry 155 may perform control of other circuitry, sub-system, or systems (not shown). In some embodiments, data processing circuitry 155 may provide the data (after processing, as desired, for example, filtering) to another circuit (not shown), such as a transducer, display, etc. In exemplary embodiments, link 150 may take a variety of forms. For example, in some embodiments, link 150 may constitute a number of conductors or coupling mechanisms, such as wires, cables, printed circuit board (PCB) traces, etc. Through link 150, signal processing circuitry 140 and data processing circuitry 155 may exchange information, such as the demodulated data, control information or signals, status signals, etc., as desired.

It will be understood that the receiver embodiment 100 of FIG. 1 is exemplary only, and that other circuit architectures are possible in other embodiments. For example, at least one filter may be optionally coupled to the output of mixer 130 to provide filtering of the RF or baseband signal at the output of mixer 130. In another example, a programmable gain amplifier (PGA) may be optionally coupled between output of mixer 130 and ADC 135 to provide programmable gain for the signal provided from mixer 130 to ADC 135. In another example, at least one filter may be provided at the output of mixer 130 with a programmable gain amplifier (PGA) coupled between the filter and ADC 135 to provide programmable gain for the filtered signal provided to ADC 135.

FIG. 2 illustrates a circuit arrangement for a RF transmitter 200 that may employ a PLL circuit configured as a local oscillator (LO) 125 according to another exemplary embodiment of the disclosed apparatus and methods. As shown, transmitter 200 includes baseband up-converter circuit 190. In this embodiment, baseband upconverter circuit 290 receives an intermediate frequency (IF) LO signal (IFLO) from LO 125. Baseband up-converter circuit 290 mixes the IFLO signal transmit I and Q signals (input signals to baseband up-converter circuit 290), and provides an up-converted IF signal to offset PLL circuitry 292. Offset PLL circuitry 292 effectively filters the upconverted IF signal (i.e., offset PLL circuit 292 allows to pass signals within its bandwidth, but attenuates other signals), thus attenuating spurious or noise signals outside its bandwidth. As a result, less filtering may be used before transmitting the RF signal via antenna 215. In the embodiment of FIG. 2, offset PLL circuitry 292 forms a feedback loop with transmit voltage controlled oscillator (VCO) circuit (or TX VCO circuit) 294 via an offset PLL output signal and a transmit VCO signal that is provided by TX VCO circuit 294. Offset PLL circuitry 292 uses a mixer (not shown) to mix an RF local oscillator (RFLO) signal from LO 125 with the transmit VCO signal. Power amplifier (PA) 296 receives the transmit VCO signal, and provides an amplified signal to antenna 215 for transmission.

Still referring to FIG. 2, transmitter 200 uses two signals (IFLO and RFLO) in its operation. To accommodate those signals, LO 125 may include circuitry that generates both the IFLO and RFLO signals, or circuitry within LO 125 may be duplicated to generate the IFLO and RFLO signals, respectively. In the illustrated embodiment, transmitter 200 uses an IF signal (IFLO), however other transmitter configurations are possible that similarly use a PLL or LO 125 according to the disclosed apparatus and methods. For example, in some embodiments, transmitter 200 may use a single LO signal, such as RFLO, to directly up-convert input signals to an RF signal for transmission by antenna 215.

FIG. 3 illustrates a RF transceiver 300 that includes a PLL circuit configured as a local oscillator (LO) 125 according to another exemplary embodiment of the disclosed apparatus and methods. As shown in FIG. 3, transceiver 300 may include a combination of at least one receiver 100 and at least one transmitter 200, e.g., such as previously described in relation to FIGS. 1 and 2. In the embodiment of FIG. 3, transceiver 300 may be configured to both receive and transmit RF signals via coupled antenna 315. It will be understood that the illustrated embodiments of FIGS. 1-3 are exemplary only and that the disclosed PLL circuits may be employed in any other type of circuit architecture to generate an output signal having a phase related to the phase of an input signal provided of the PLL. Examples of such other types of circuit architectures may be found, for example, described in U.S. patent application Ser. No. 15/179,847 filed Jun. 10, 2016, which is incorporated herein by reference in its entirety for all purposes.

Figure 4:
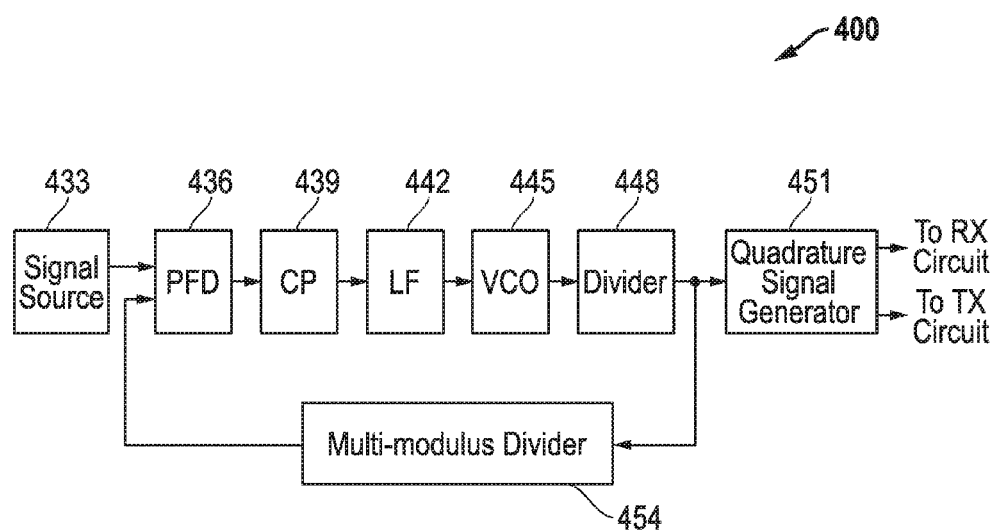
FIG. 4 illustrates a simplified block diagram of a PLL circuit arrangement according to one exemplary embodiment of the disclosed apparatus and methods.

FIG. 4 illustrates one exemplary embodiment of a PLL circuit arrangement 400 (e.g., such as may be configured as a LO 125) and having one or more magnetically differential loop filter capacitor elements that are physically positioned adjacent LC-VCO inductor/s. In one embodiment, PLL circuitry 400 may be configured to form a frequency synthesizer that provides one or more LO signals (e.g., an LO signal for use in an RF receiver 100, an LO signal for use in an RF transmitter 200, or both for a transceiver 300, as shown at the output of quadrature signal generator 457, etc.), as desired. It will be noted that in the case of generation of a single LO signal, circuitry corresponding to generation of a second LO signal (e.g., buffers) may be omitted.

Still referring to FIG. 4, PLL 400 includes a signal source 433 that generates an input signal to phase/frequency detector (PFD) 436. A variety of devices, circuits, or blocks may be used to implement signal source 433. Example types of signal sources 433 include, but are not limited to, crystal (XTAL) oscillator, resistor capacitor (RC) oscillator, inductor capacitor (LC) oscillator, etc. In the illustrated embodiment, signal source 433 includes an oscillator that provides an oscillator signal or oscillator output signal to PFD 436, and PFD 436 receives a second input signal from multi-modulus divider 454. In this embodiment, multi-modulus divider 454 is coupled in a negative feedback loop that also includes PFD 436, charge pump (CP) 439, loop filter (LF) 442, VCO 445, and divider 448. Multi-modulus divider 454 divides the frequency of the output signal of divider 448 by a desired factor to generate an output feedback signal (sometimes known as a clock feedback signal) that drives an input of PFD 136. This division operation lowers the frequency of the input signal to PFD 436 to a level comparable to the frequency of the input signal provided by signal source 433. PFD 436 in turn provides an output signal that represents or is related to the difference in phase or frequency of its two input signals.

Still referring to FIG. 4, charge pump 439 receives the output signal of PFD 436. In response, CP 439 provides an output signal to loop filter 442. Loop filter 442 filters (e.g., such as low-pass filtering) the signal received from charge pump 439, and provides the resulting filtered signal to VCO 445 that serves as the voltage control signal for VCO 445. In response to the voltage control signal from loop filter 442, VCO 445 generates an output signal with a certain frequency that drives divider 448. The frequency of the output signal of VCO 445 depends on the voltage level of the control signal from loop filter 442. Thus, variations in the control signal from loop filter 442 cause corresponding changes in the frequency of the output signal of VCO 445. Given that the control signal from loop filter 442 represents or is derived from the difference in phase or frequency in the two input signals of PFD 436, loop filter 442 drives VCO 445 (coupled in the feedback loop with multi-modulus divider 454, as noted above) so as to reduce the difference in phase or frequency in the two input signals of PFD 436.

As shown in FIG. 4, divider 448 divides the frequency of the output signal of VCO 445 by a desired number, e.g., such as the number four or other greater or lesser number as is needed or desired for a particular application. The output signal of divider 448 drives the inputs of multi-modulus divider 454 and quadrature signal generator 451. Quadrature signal generator 451 generates one or more signals as its output signals. For example, in the embodiment shown, quadrature signal generator 451 provides two output signals, one that drives receiver circuits, and one that drives transmit circuits, although other numbers of output signals may be generated and used, for instance, a single output signal. In any case, each output signal of quadrature signal generator 451 includes two signals, i.e., an in-phase (I) and a quadrature (Q) signal.

Figure 5:
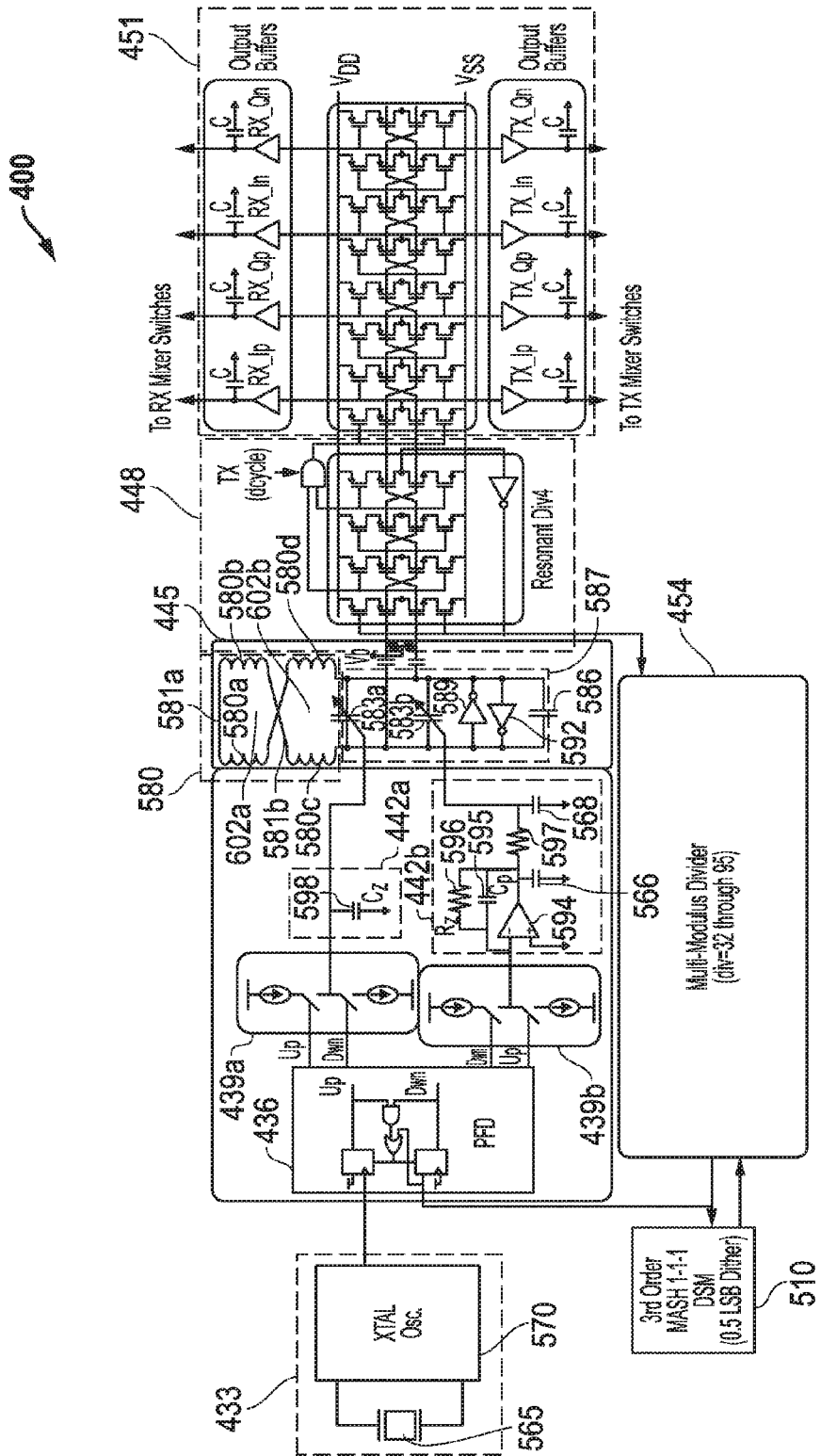
FIG. 5 illustrates a simplified block diagram of a PLL circuit arrangement according to one exemplary embodiment of the disclosed apparatus and methods.

FIG. 5 illustrates one particular exemplary embodiment of a PLL circuit arrangement 400 as it may be configured in further detail. In this embodiment, signal source 433 is a crystal-based source, which includes crystal 565 coupled to a crystal oscillator 570, and PFD 436 may be implemented using a variety of circuitry (e.g., using flip flops). In this embodiment, two charge pumps 439a and 439b may each include switches driven by respective output signals of PFD 436, and currents sourced/sunk by current sources of charge pumps 439a and 439b are provided to or withdrawn from respective dual path loop filters 442a and 442b. In this exemplary embodiment, charge pump 439a corresponds to the integrating path of the VCO 445 and feeds loop filter 442a, which includes loop filter capacitor 598. Charge pump 439b corresponds to the direct path (the other path) of the VCO 445 and feeds loop filter 442b, which in this is a low pass RC-RC filter, where "RC" denotes resistor-capacitor. Loop filter 442b includes transconductance current amplifier (TIA) 594, with a feedback circuitry that includes capacitor 595 and resistor 596. The output of TIA 594 drives the direct path of the VCO via resistor 597 with loop filter capacitor 566 and capacitor 568 coupled as shown. Thus, the output of loop filter 442a drives the integrating path of VCO 445, while the output of loop filter 442b drives the direct path of VCO 445.

It will understood that loop filters 442a and 442b of FIG. 5 are exemplary only, and that the values and configuration or arrangement of the components in each of loop filters 442a and 442b may depend on the type and characteristics of the desired transfer function of each filter 442a and 442b for a given application. It will also be understood that the PLL circuit arrangement 400 of FIG. 5 represents only one possible way of implementing a PLL 400 according to the disclosed apparatus and methods. In this regard, signal source 433, PFD 436, charge pump/s 439, and/or loop filter/s 442 may be implemented in other ways as desired or needed to fit the characteristics of a given PLL output signal generation application. For example, a PLL circuit 400 may be alternatively implemented with a single integrating signal path that includes a single charge pump 439 and loop filter 442 that drives a single path VCO 445. Examples of such other types of PLL circuit architectures may be found, for example, described in U.S. patent application Ser. No. 15/179,847 filed Jun. 10, 2016, which is incorporated herein by reference in its entirety for all purposes.

Still referring to FIG. 5, VCO 445 includes an inductor 580 coupled in a resonant tank with capacitor 586 and variable capacitors 583a and 583b. Inductor 580 in this exemplary embodiment includes multiple inductor elements (segments) 580a-580d, although other numbers and/or arrangements of one or more inductor elements or segments might be used, as desired. For example, in one embodiment VCO inductor 580 may be a single continuous inductor segment. It will be understood that VCO inductor 580 may be a structure that is formed from any suitable type or combination of types of conductor materials, e.g., bond wires, traces within an integrated circuit such as traces within a metal layer, etc. Moreover, although FIG. 5 illustrates a VCO inductor structure having a "figure eight" shape including two inductor loops 581a and 581b that define two respective enclosed device areas 602a and 602b therein, other VCO inductor loop geometries that define an enclosed area therein are also possible, e.g., circular, oval, octagonal, rectangular, etc. Further, a structure of a VCO inductor 580 may be alternatively configured in other embodiments with a single inductor loop having a single enclosed device area, or more than two inductor loops having more than two respective enclosed device areas.

In the embodiment of FIG. 5, VCO frequency control circuitry 587 that includes the parallel combination of capacitor 586 and variable capacitors 583a and 583b (plus any other capacitance that effectively appears in parallel with capacitor 586 and variable capacitors 583a and 583b) is coupled in parallel with inductor 580 to form a resonant tank. The output signals of loop filters 442a and 442b control the capacitance of variable capacitor 583a and 583b, respectively, and thus the frequency of oscillation of the LC resonant tank. Back to back coupled inverters 589 and 592 provide a negative transconductance or resistance to sustain resonance in the tank (i.e., compensate for circuit losses because of parasitic elements, e.g., conductor resistance) in the tank or, generally, in VCO 445. The output signal of VCO 445, coupled across the resonant tank, drives divider 448.

Also shown in FIG. 5 is divider 448 as it may be configured according to one exemplary embodiment. As shown, the output signals of VCO 445 are AC-coupled to the input of divider 448 via DC block capacitors, with resistors coupled to a bias voltage Vb to provide DC bias for the circuitry in divider 448, e.g., such as certain transistors in four transistor stacks of divider 448 that form two master slave flip flops. As shown, divider 448 may further include logic circuit 206 (e.g., modified NAND gate) that changes the pulse width or duty cycle of the output signal of divider 448. As a result, LO 125 can generate in-phase and quadrature signals of different duty cycles (e.g., for RF reception and RF transmission, respectively). As further shown, quadrature signal generator 451 of the embodiment of FIG. 5 includes a shift register, formed by four cascaded flip flops, with each flip flop including two stack of four transistors, coupled in cascade. Output buffers of quadrature signal generator 451 provide at their outputs a differential in-phase signal (i.e., a signal TX_I, represented by signals TX_Ip and TX_In) and a differential quadrature signal (i.e., a signal TX_Q, represented by signals TX_Qp and TX_Qn) for use in an RF transmitter circuit, for instance, by mixer switches in transmitter 200. Similarly, output buffers of quadrature signal generator 451 provide at their outputs a differential in-phase signal (i.e., a signal RX_I, represented by RX_Ip and RX_In) and a differential quadrature signal (i.e., a signal RX_Q, represented by signals RX_Qp and RX_Qn) for use in an RF receiver circuit, for instance, by switches in mixer 130 of receiver 100.

As previously described, the output signal of divider 448 drives the input of multimodulus divider 454 which in turn divides the frequency of the output signal of divider 448 to lower the frequency of the input signal to PFD 436 to a level comparable to the frequency of the input signal from signal source 433. As shown in FIG. 5, multimodulus divider 454 of this exemplary embodiment includes divider and counter circuitry and is coupled to receive a dithered signal from delta-sigma modulator 510.

Figure 6:
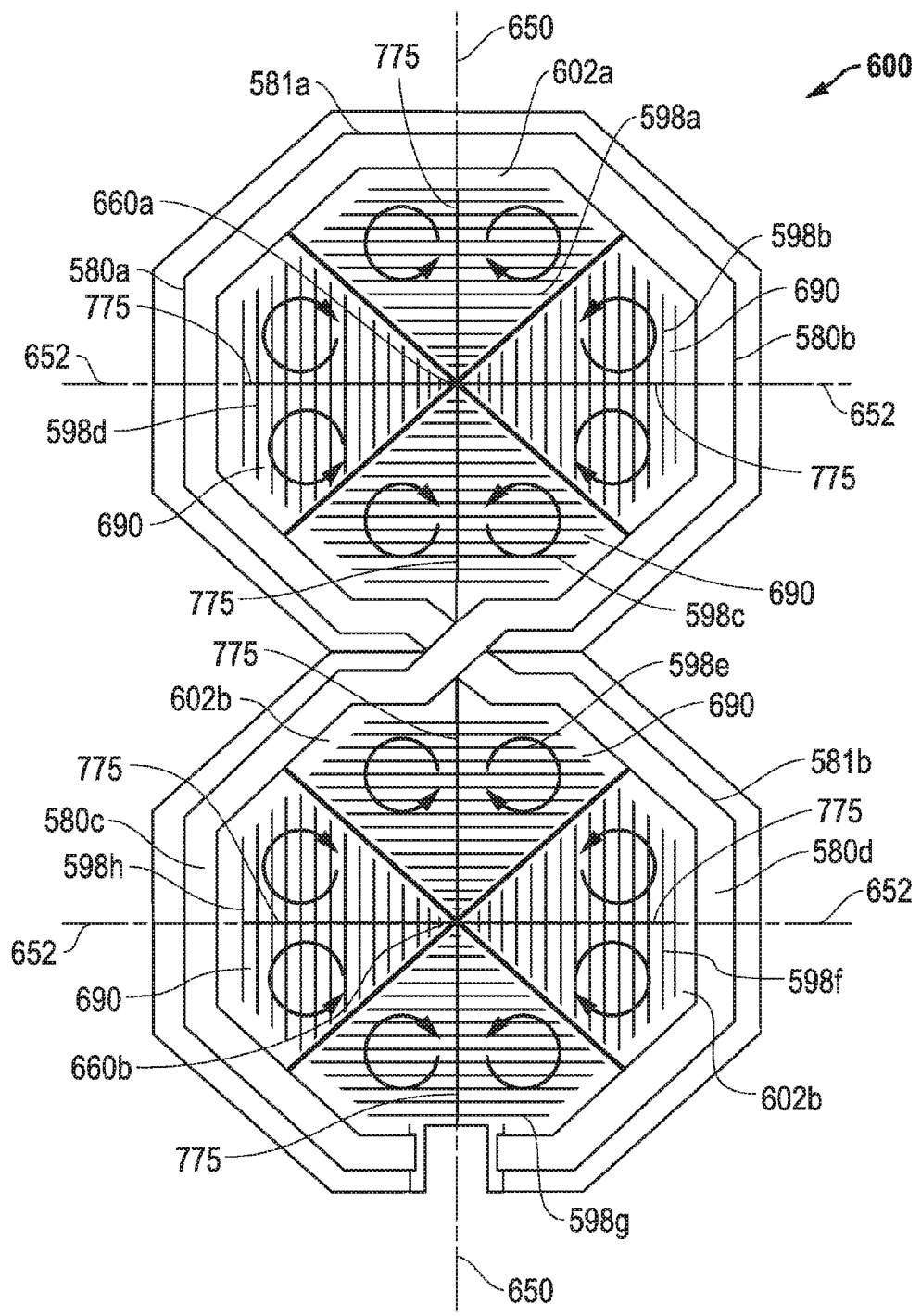
FIG. 6 illustrates an overhead cross sectional view showing relation between VCO inductor and magnetically differential loop filter capacitor segments according to one exemplary embodiment of the disclosed apparatus and methods.

FIG. 6 illustrates an overhead view of the relation 600 between VCO inductor 580 and magnetically differential loop filter capacitor segments 598a-598h in a semiconductor device that includes PLL circuitry according to one exemplary embodiment of the disclosed apparatus and methods. In the embodiment of FIG. 6, capacitor segments 598a-598h may be formed (or laid out) in coupled relationship to each other within respective semiconductor device areas 602a and 602b that are enclosed by separate inductor loops 581a and 581b of a VCO inductor 580 of a PLL circuit 400 such as described in relation to FIG. 5. In this regard, the size of loop filter capacitor 598 (e.g., 100 pF) of loop filter 442a is relatively larger than the size of loop filter capacitor 566 (e.g., 1.2 pF) of loop filter 442b in the embodiment of FIG. 5. Thus, more device real estate may be conserved by selecting to enclose magnetically differential loop filter capacitor segments 598a-598h of the larger loop filter capacitor 598 within inductor loops 581a and 581b of VCO inductor 580. However, it will be understood that in other embodiments one or more magnetically differential loop filter capacitor elements of loop filter capacitor 566 may alternatively or additionally be enclosed within one or more inductor loops of a VCO inductor 580. In one embodiment, inductor loops 581a and 581b, as well as capacitor segments 598a-598h, may each formed of copper, e.g., by using a combination of steps including oxide patterning, copper layer deposition and chemical mechanical polishing (CMP) of a damascene or dual damascene process. However, it will be understood that one or more loop filter capacitor elements may be formed adjacent one or more VCO inductor loops in a similar manner using any other type of suitable conductor material and suitable process for forming the same.

Still referring to the exemplary embodiment of FIG. 6, a single relatively larger loop filter capacitor 598 of PLL 400 may be split or subdivided into multiple relatively smaller (e.g., about 3 microns×3 microns or any other suitable size) metal-oxide-metal (MoM) finger capacitor segments 598a-598h that are arranged in triangular or pie-shaped capacitor pattern areas 690 within one of device areas 602a or 602b that are enclosed by VCO inductor loops 581, e.g., completely or partially replacing the small metal pieces of the density fill that is conventionally required in such areas. In such an embodiment, these relatively smaller finger capacitor segments 598a-598h advantageously exhibit relatively small eddy losses. Magnetically differential placement of the finger capacitors may be employed to further reduce interaction between the magnetic fields of the elements of inductor 581 and those arising from the current through the segments of loop filter capacitor 598, thus reducing spurious coupling.

Figure 11:
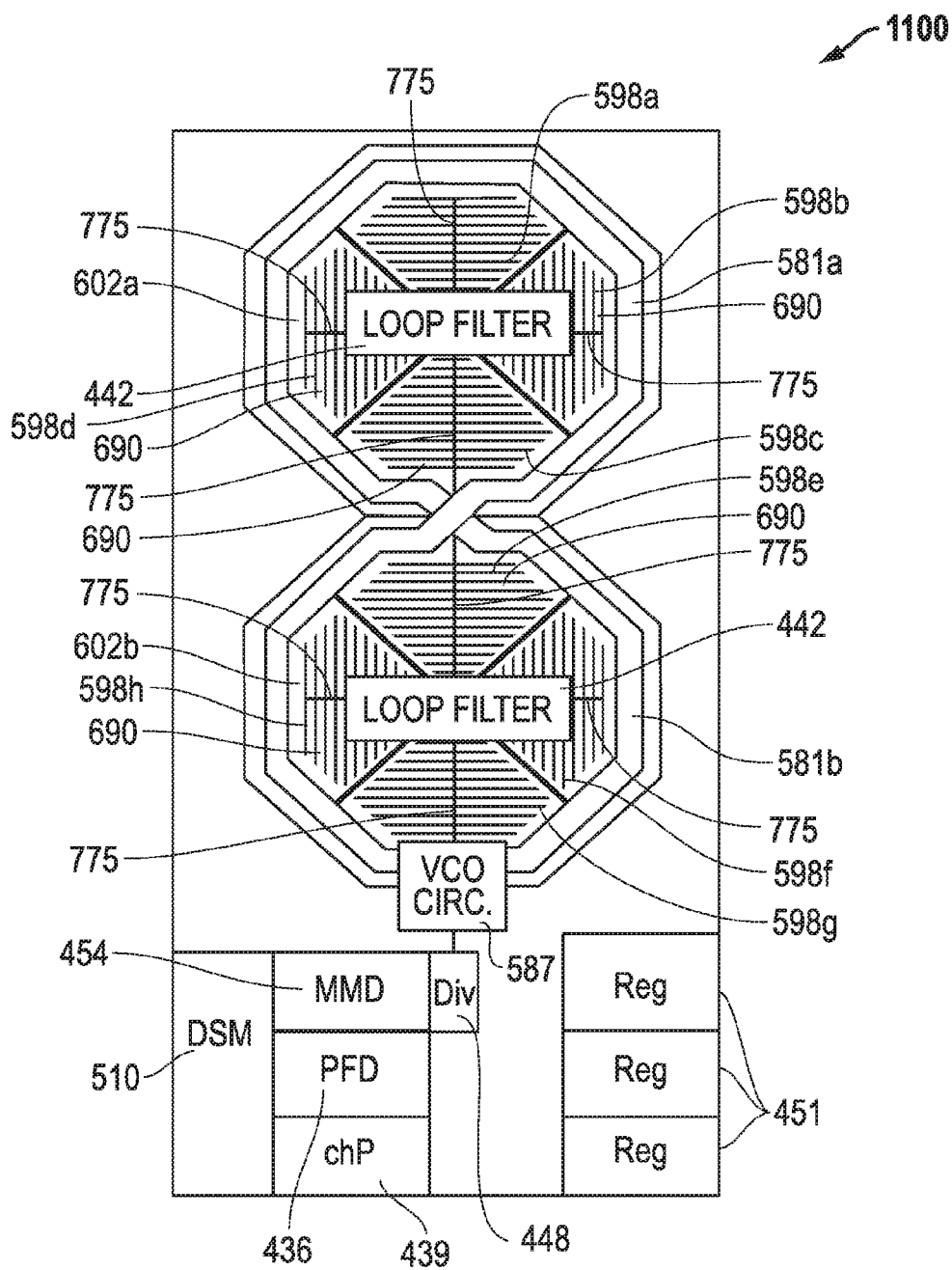
FIG. 11 illustrates an overhead view of a semiconductor device layout for a PLL frequency synthesizer circuit according to one exemplary embodiment of the disclosed apparatus and methods.

As shown in the example of FIG. 6, the multiple magnetically differential finger capacitor segments 598a-598h may each be laid out in one of the four triangular pie-shaped capacitor pattern areas 690 that are defined within each of enclosed device areas 602a and 602b that are enclosed by inductor loops 581a and 581b respectively. In the embodiment of FIG. 6, inductor loops 581a and 581b are coupled together. Inductor loop 581a encloses area 602a, and inductor loop 581b is completed by frequency control circuitry 587 to enclose area 602b as shown in FIGS. 5 and 11.

As used herein, device area that is "enclosed" by an inductor loop 581 refers to all portions of the layers or other materials of a semiconductor device that lie directly beneath or directly above the open area (e.g., areas 602a and 602b of overhead view of FIG. 6) defined within an inductor loop 581, but not including the portions of the layers or other materials of the semiconductor device that do not lie directly beneath or above the open area defined within the inductor loop 581. The magnetically differential nature of each of the multiple finger capacitor segments 598a-598h is illustrated by the opposing circular arrows that represent current dipoles formed within each of finger capacitor segments 598a-598h during PLL circuit operation. In this embodiment, the geometry of each of finger capacitor segments 598a-598h is laid out so as to create an axis of symmetry 650 or 652 that bisects each of finger capacitor segments 598a-598h and separates the two opposing induced currents of the current dipole formed within each of finger capacitor segments 598a-598h. In this way, ground/signal loops may be avoided in the layout of the finger capacitor segments 598a-598h to minimize eddy losses. As will be further described, capacitance to the raw substrate may be minimized in a further embodiment by placing the capacitor in a grounded enclosure as described elsewhere herein.

In one embodiment, the ground and signal conductors for the magnetically differential finger capacitor segments 598 of each of the four triangular capacitor pattern areas 690 (e.g., see FIG. 8) of a device area 602 may be coupled together at the center 660 of the given device area 602 within the inductor loop 581a or 581b as shown in FIG. 6. The signal/ground lines may be laid out using metal wires on top of each other, to reduce magnetic coupling from loop filter capacitor 598 to the VCO inductor 581. For example, the signal trace may in one embodiment be laid out in a higher metal and the ground trace could be laid out directly beneath it in a lower metal layer. The capacitor segments 598 positioned within the defined triangular capacitor pattern areas 690 that are connected at the center are in turn connected together again through signal/ground metal wires that run on top of each other through the center of the inductor and finally connect to the frequency control port (e.g., capacitance control port of variable capacitors 583a and 583b) of the VCO 445. It will be understood that FIG. 6 is exemplary only, and that other geometries and/or number of magnetically differential capacitor patterns may be defined within the device area enclosed by a given VCO inductor (i.e., other than the triangular capacitor pattern areas 690 illustrated in FIG. 6) to achieve a similar magnetically differential capacitive effect within the enclosed device area within the VCO inductor.

Figure 7A:
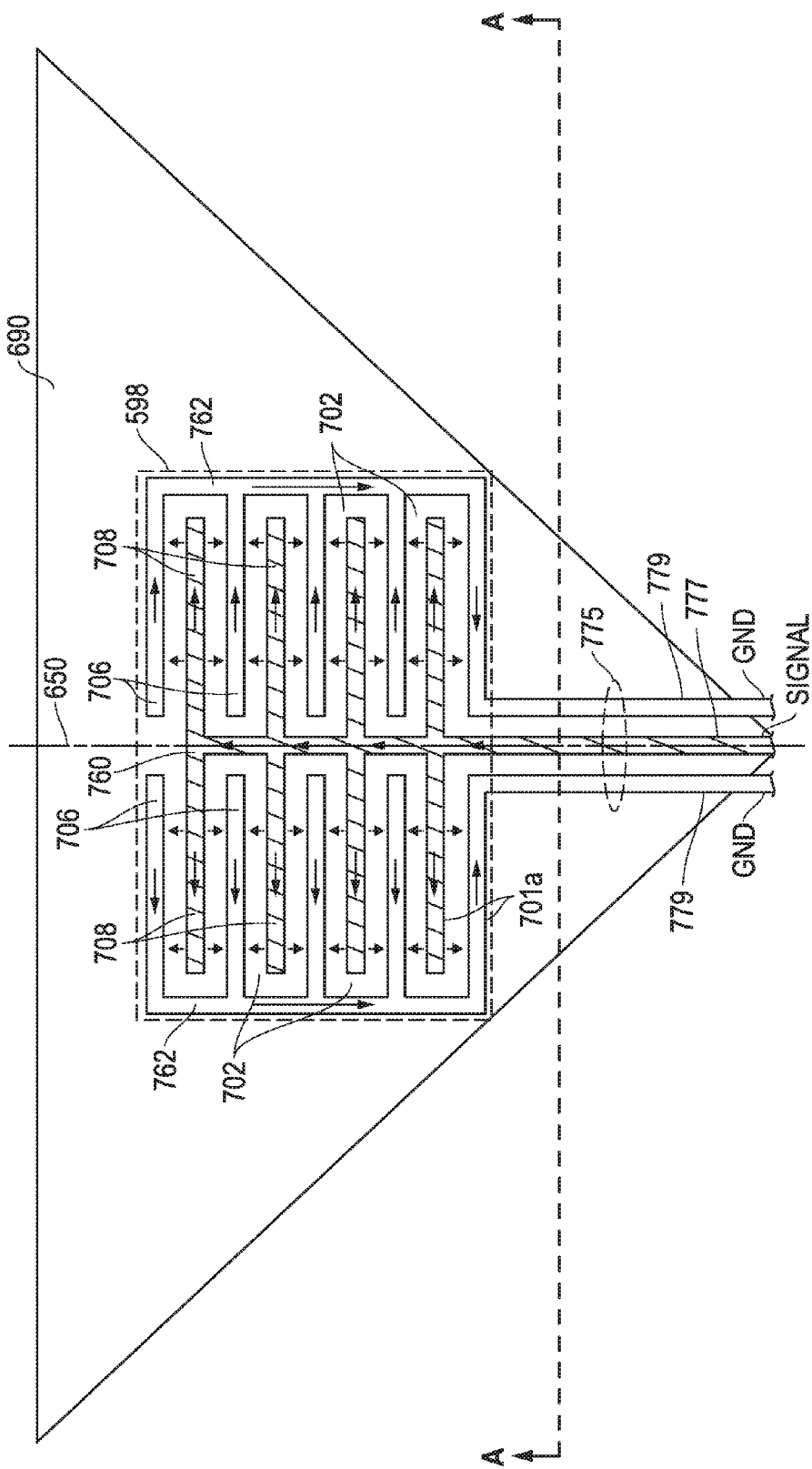
FIG. 7A illustrates an overhead cross sectional view of a loop filter capacitor element according to one exemplary embodiment of the disclosed apparatus and methods.
Figure 8:
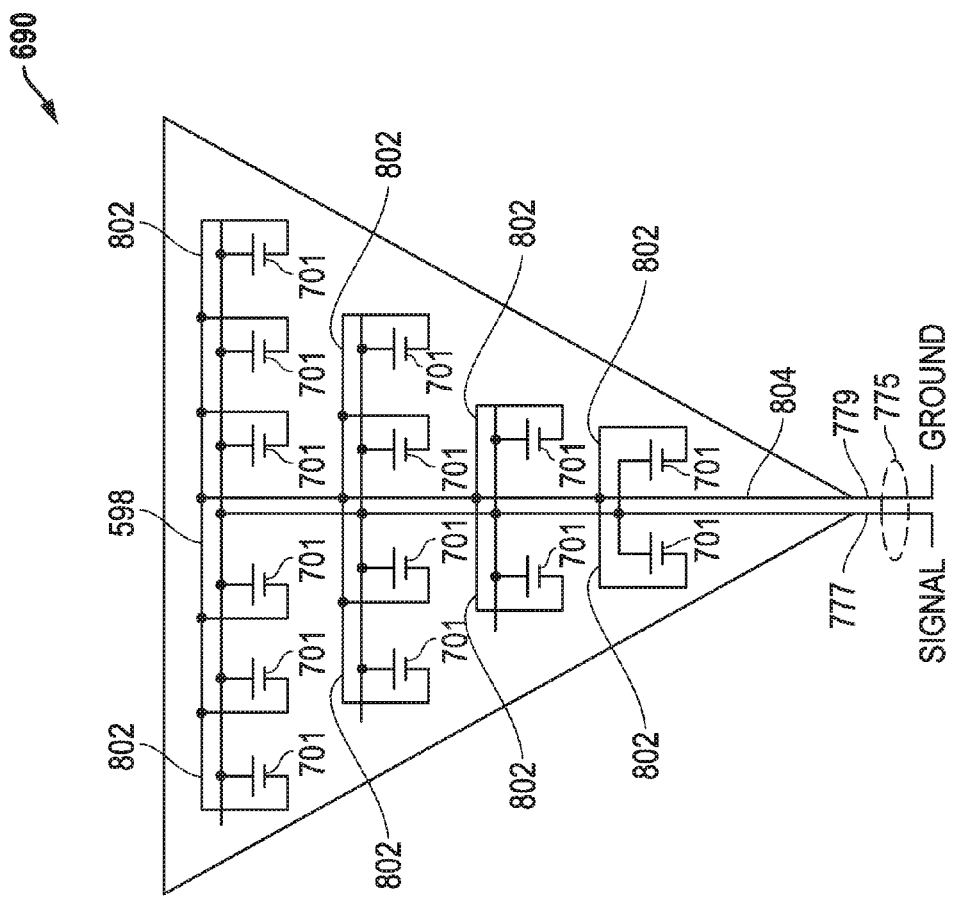
FIG. 8 illustrates a simplified block diagram of a capacitor segment that includes multiple capacitor elements according to one exemplary embodiment of the disclosed apparatus and methods.

FIG. 7A illustrates a cross-sectional overhead view of one of the triangular capacitor pattern areas 690 of FIG. 6 as it may be configured in one exemplary embodiment. In the embodiment of FIG. 7A, the capacitor segment 598 within each triangular capacitor pattern area 690 may include a single capacitor element 701a that is formed from two capacitor electrodes 760 and 762 that are separated from each other by suitable dielectric material 702 (such as silicon dioxide, silicon oxycarbide, etc.) and that are coupled to respective signal and ground (e.g., circuit ground) paths of a PLL circuit 400. However, in another embodiment, a capacitor segment 598 within each capacitor pattern area 690 may include multiple such capacitor elements 701a such as illustrated in the embodiment of FIG. 8.

Visible in FIG. 7A is an upper semiconductor device conductor (e.g., metal) layer of capacitor element 701a that includes inter-digitated signal and ground lines (fingers), i.e., with signal line fingers 708 extending outward from a central member of capacitor electrode 760 and with ground line fingers 706 extending inward outer members of capacitor electrode 762. It will also be understood that the particular geometry of signal and ground (GND) lines of capacitor element 701*a* may be reversed or interchanged in other embodiments such that ground line fingers extend outward from the center of the capacitor element 701*a* and signal line fingers extend inward toward the center of the capacitor element 701*a*. In the embodiment of FIG. 7A, signal line 777 and ground (GND) line 779 are shown routed in side by side relationship 775 from the capacitor element 701 to center of enclosed device area for connection to the frequency control circuitry 587 of VCO 445. However, it will be understood that in an alternative embodiment signal and ground (GND) lines may be instead routed on top of each other from the VCO frequency control circuitry 587 to each capacitor element 701, e.g., by laying out metal wires on top of each other as previously described.

As shown in FIG. 7A, the configuration of capacitor element 701*a* defines an axis of magnetically differential symmetry 650 that is denoted with a dashed line in FIG. 7A. In this regard, capacitor element 701*a* includes two finger capacitor structures that are positioned on either side of this axis 650 that are mirror images of each other. This mirror image configuration results in a magnetically differential symmetry of current flow (or current dipole components) on opposing sides of axis 650 of capacitor element 701*a* in which the magnetic fields created by the capacitor current flows on opposite sides of axis 650 at least partially or completely cancel each other out. Consequently, little or no current is induced within VCO inductor 581 by magnetic fields resulting from the current flows in capacitor element 701*a* during operation of PLL circuit 400. Direction of the flow of these current dipole components during PLL circuit operation are shown by arrows superimposed on ground line fingers 706 and signal line fingers 708 of capacitor element 701*a*. The current flow depicted by the arrows in FIG. 7A results from the operation of charge-pump of the PLL which injects currents into the loop filter capacitor at the frequency of the crystal oscillator. It will be understood that FIG. 7A is exemplary only, and that the number and geometry of ground line fingers 706 and signal line fingers 708 provided for a given loop filter capacitor element 701 may vary, as may the number and size of individual loop filter capacitor elements 701 that may be enclosed by a VCO inductor loop.

Figure 7B:
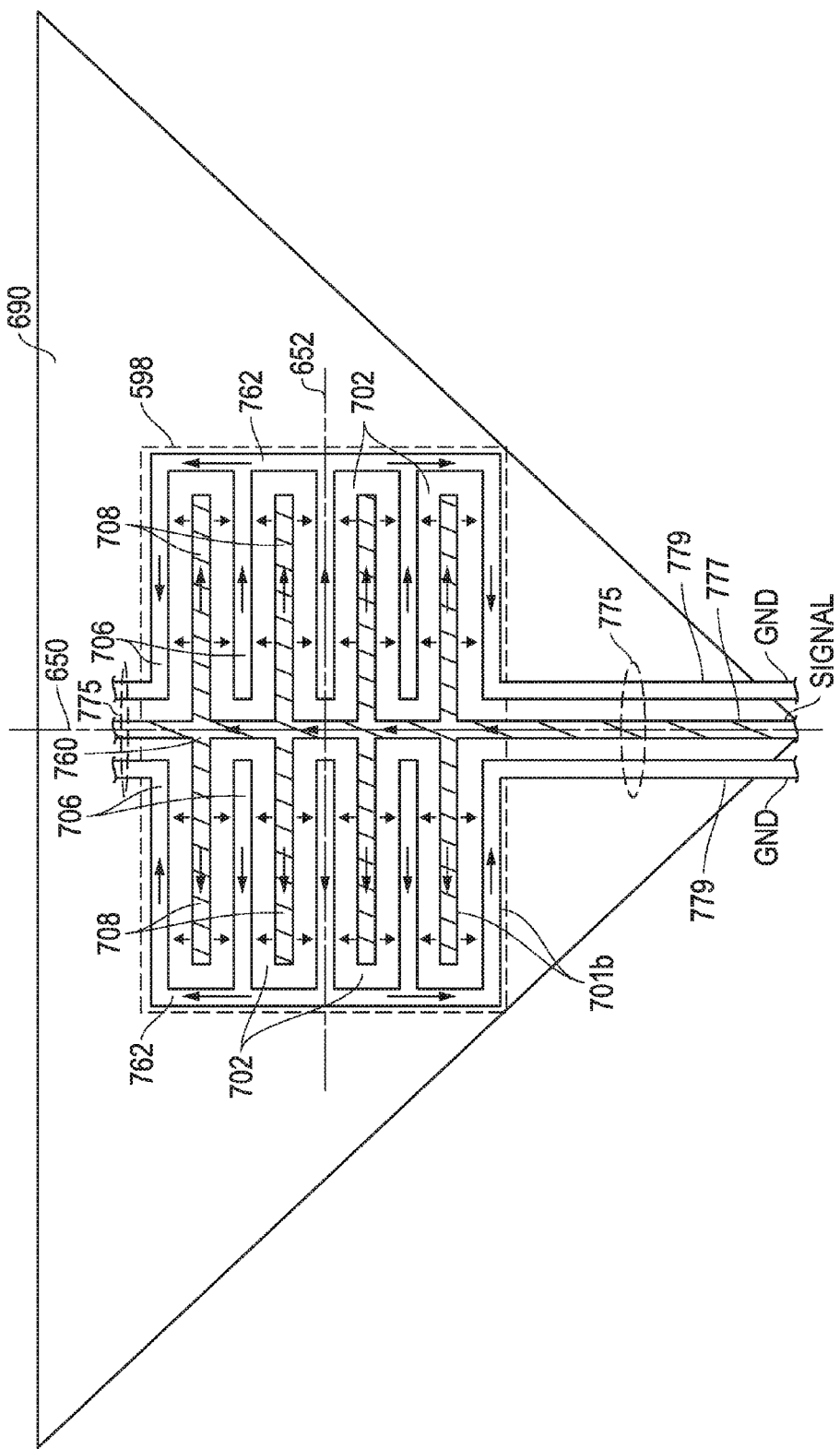
FIG. 7B illustrates an overhead cross sectional view of a loop filter capacitor element according to one exemplary embodiment of the disclosed apparatus and methods.

FIG. 7B illustrates a cross-sectional overhead view of one of the triangular capacitor pattern areas 690 of FIG. 6 as it may be configured according to another exemplary embodiment of the disclosed apparatus and methods. In the embodiment of FIG. 7B, the capacitor segment 598 within each triangular capacitor pattern area 690 may include a single capacitor element 701*b* that is formed from two capacitor electrodes 760 and 762 that are coupled to respective signal and ground paths of a PLL circuit 400. However, in another embodiment, a capacitor segment 598 within each capacitor pattern area 690 may include multiple such capacitor elements 701*b* such as illustrated in the embodiment of FIG. 8.

Visible in FIG. 7B is an upper semiconductor device conductor (e.g., metal) layer of capacitor element 701*b* that includes inter-digitated signal and ground lines (fingers) of a semiconductor device metal layer in manner similar as described in relation to FIG. 7A. In this alternative embodiment, the signal and ground lines 775 of capacitor element 701*b* are coupled at opposing ends to VCO frequency control circuitry 587 so to define two perpendicular axes of magnetically differential symmetry 650 and 652 that are denoted with dashed lines in FIG. 7B. In this regard, capacitor element 701*a* includes two finger capacitor structures that are positioned on either side of this axis 650 that are mirror images of each other to create a magnetically differential symmetry of current flow (or current dipole components) on opposing sides of axis 650 of capacitor element 701*b* in which the magnetic fields created by the capacitor current flows on opposite sides of axis 650 cancel each other out in manner similar to embodiment of FIG. 7A. However, in the embodiment of FIG. 7B, directions of current flows within each of these two finger capacitor structures is also bifurcated as shown by the arrows in FIG. 7B to create a magnetically differential symmetry of current flow (or current dipole components) within each of the two finger capacitor structures, i.e., on opposing sides of axis 652 of each capacitor structure such that the magnetic fields created by the capacitor current flows on opposite sides of axis 652 also cancel each other out. The embodiment of FIG. 7B may be employed, for example, where any resulting eddy losses and inductor quality factor reduction due to a created loop of ground and/or loop of signal lines is acceptable for a given PLL circuit application.

In some embodiments, a capacitor segment 598 may include multiple capacitor elements 701 (e.g., such as multiple capacitor elements 701*a* and/or 701*b* of FIGS. 7A and 7B) that are electrically coupled together within a single device area 602 that is enclosed by an inductor loop 581. It is further possible that multiple capacitor elements 701 may be provided within a given one of the capacitor pattern areas 690 such as illustrated in FIG. 8. For purposes of simplicity, each of multiple capacitor elements 701 of FIG. 8 are illustrated by a capacitor symbol, it being understood that each individual capacitor element 701 of FIG. 8 may be an individual capacitor element 701*a* of FIG. 7A, an individual capacitor element 701*b* of FIG. 7B, or an individual capacitor element 701 having any other finger capacitor configuration (e.g., number of interdigitated capacitor fingers) and geometry that is suitable for a given application. As shown in FIG. 8, multiple rows of capacitor elements 701 are coupled by branch signal/ground conductors 802 to extend from opposing sides of a central (or trunk) signal/ground conductor 804. Central signal/ground conductor 804 may in turn be coupled together with similar central single ground conductors 804 of other capacitor pattern areas 690 that are defined within an enclosed device area 602 of a given inductor loop 581. As shown length of branch signal/ground conductors 802 becomes shorter (and number of coupled capacitor elements 701 becomes fewer) toward the center of the enclosed device area 601 in order to fit the narrower end of capacitor pattern area 690. It will be understood that the number of capacitor elements 701, the number of branch conductors 802, and the number of central conductors 804 may be independently varied in other embodiments while still maintaining magnetically differential symmetry within a given capacitor pattern area 690 and within an enclosed area 602 of an inductor loop 581.

Figure 9:
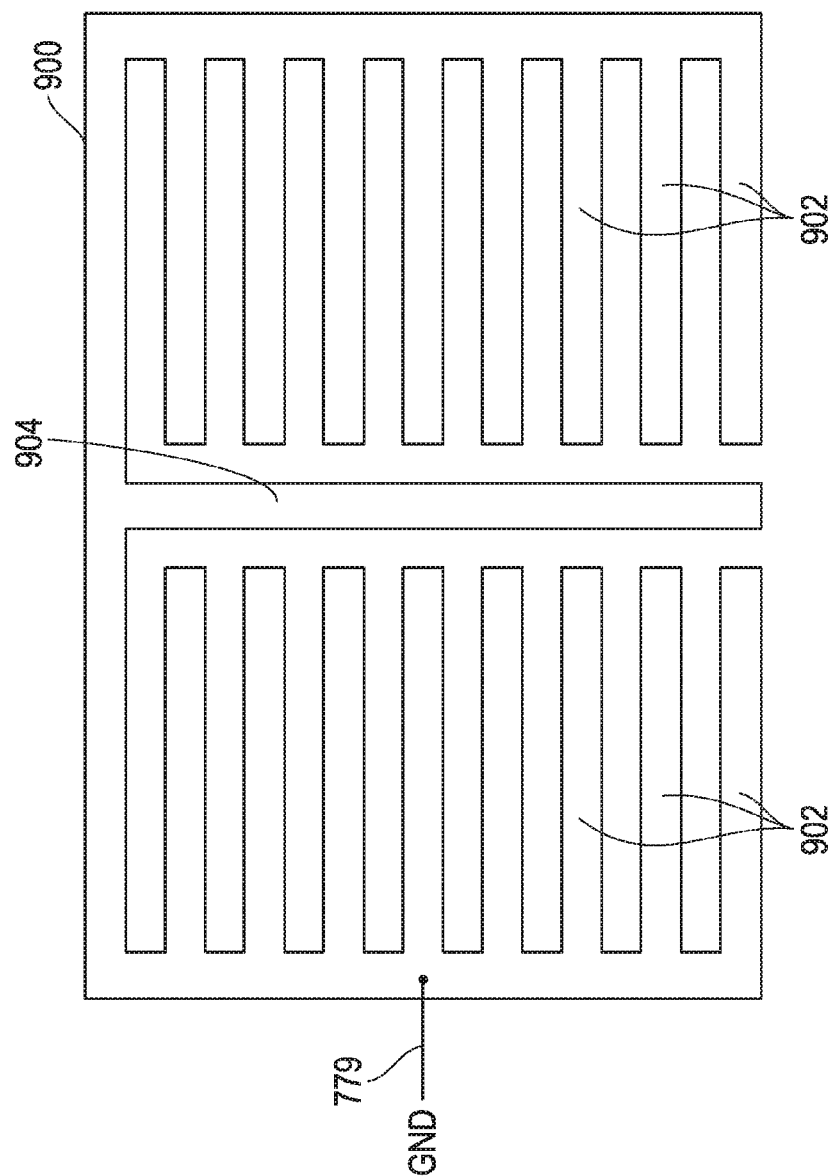
FIG. 9 illustrates an overhead cross sectional view of a ground shield according to one exemplary embodiment of the disclosed apparatus and methods.

FIG. 9 illustrates a cross-sectional overhead view of an optional metal ground pattern shield 900 that may be formed, for example, in a lower metal layer or polysilicon layer below the inter-digitated metal signal and ground fingers of a capacitor element 701*a* such as illustrated in FIG. 7A. As shown, optional metal ground pattern shield 900 may be coupled to circuit ground (e.g., to shield from noise or other circuitry formed on the substrate 930), and may include interdigitated fingers 902 that correspond to, and are aligned with, signal line fingers 708 and ground line fingers 706 of the overlying layer/s of the capacitor element 701a, and central member 904 that corresponds to and is aligned with the central signal line of capacitor element 701a. It is noted that the number of device layers separating the ground shield from the bottom-most finger capacitor layer may be varied as desired. However, the number of device layers separating the ground shield from the bottom-most finger capacitor layer affects the density of the overlying capacitor element 701, i.e., for a given number of available metal device layers any un-used metal layers between the ground shield 900 and the lowest capacitor finger layer reduces the number of metal layers that are available for the finger capacitor stack which results in a shorter capacitor element 701 and lower density (capacitance per unit area). Thus, in some embodiments it may be desirable (though not required) to use an adjacent underlying metal or polysilicon device layer for a ground shield 900.

Figure 10:
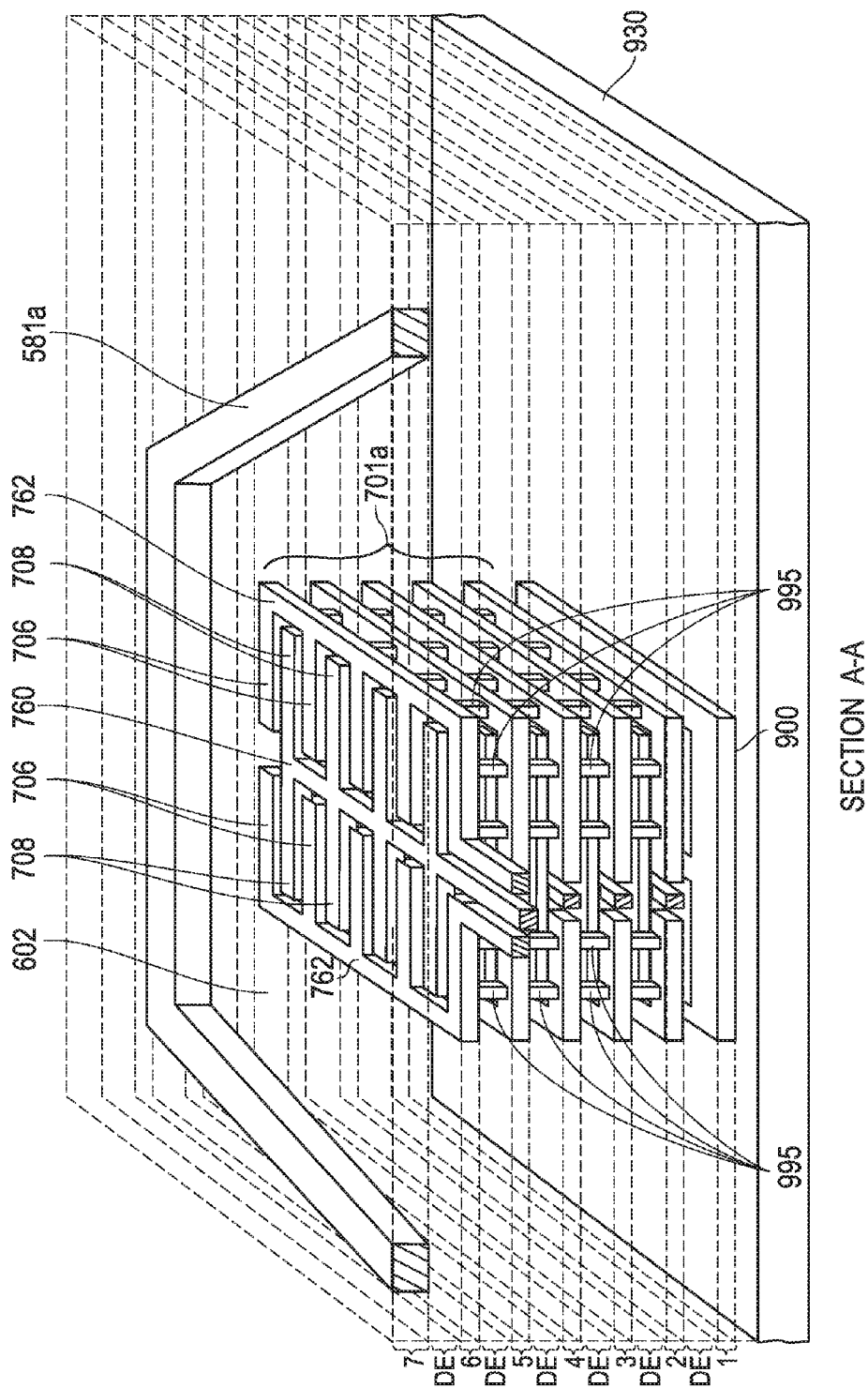
FIG. 10 illustrates a perspective cross sectional view of a multi-layer metal-oxide-metal vertical capacitor element and a surrounding VCO inductor according to one exemplary embodiment of the disclosed apparatus and methods.

FIG. 10 illustrates a cross-section AA taken from FIG. 7A showing a perspective view of one exemplary embodiment of a multi-layer metal-oxide-metal capacitor element 701a and surrounding VCO inductor 581a as they may be formed from a stack of metal layers on a semiconductor substrate 930 (e.g., such as crystalline silicon or other suitable semiconductor substrate) to implement a PLL RF frequency synthesizer circuit 400 such as illustrated and described in relation to FIG. 4. In one embodiment, metal-oxide-metal capacitor element 701a and VCO inductor 581a may be formed together with other circuitry of a PLL circuit 400 on a semiconductor substrate. For example, underlying circuitry for PLL circuit 400, such as transistors and gates for other circuitry, may be first formed on a silicon wafer using front-end-of-line (FEOL) wafer processing steps. Thereafter, the separate metal layers 1 through 7 of the illustrated structure may be formed on the wafer during back-end-of-line (BEOL) wafer processing, e.g., using damascene or dual-damascene process known in the art. In one embodiment, metal layers 1 through 7 may be copper or copper alloy although other suitable conductive materials may be employed, e.g., such as aluminum, aluminum alloy, other conductive materials, etc.

In the embodiment of FIG. 10, multi-layer (e.g., multi-layer metal-oxide-metal) capacitor element 701a is positioned within a device area 602 that is enclosed by a VCO inductor loop 581a such as illustrated and described in relation to FIG. 7A. As shown, multi-layer metal-oxide-metal capacitor element 701a is a vertical capacitor formed from two capacitor electrodes 760 and 762 that are separated from each other by a suitable dielectric such as silicon oxide, silicon oxycarbide, etc. As shown, each of capacitor plates or electrodes 760 and 762 includes multiple conductor (e.g., metal) electrode layers electrically coupled together by conductive (e.g., metal) vias 995 that are visible in FIG. 10 Not visible in FIG. 10 are similarly formed conductive (e.g., metal) vias 995 that may be present to electrically couple together the separate conductive layers of capacitor electrode 760 in similar fashion.

In the embodiment of FIG. 10, electrodes 760 and 762 are formed from five metal layers 2 through 6 that are separated from each other by a suitable dielectric layer (denoted as "DE" in FIG. 10), such as silicon dioxide, silicon oxycarbide, etc. Dielectric material may also be present within each metal layer surrounding the metal features of that layer. In FIG. 10, the dielectric material (including dielectric layers between metal layers 1-7 and dielectric material of each metal layer) is transparently shown for purposes of illustrating the metal structure. Inductor loop 581a of this exemplary embodiment is formed from metal layer 7 that is separated from the upper capacitor electrode layers by a suitable dielectric such as silicon dioxide, silicon oxycarbide, etc. In this illustrated exemplary embodiment, capacitor electrodes 760 and 762 lie directly beneath the open area 602 defined within the inductor loop 581a, but do not lie directly beneath the metal material (e.g., metal 7) of the inductor loop 581a itself. It will be understood that in an alternative embodiment, capacitor electrodes 760 and 762 may be formed to lie directly above an open area 602 defined within an inductor loop 581a. e.g., such as in the case where capacitor electrodes 760 and 762 are formed from metal layers 2-6 that overlie an inductor loop 581a that is formed from metal layer 1.

As shown, in one embodiment inductor loop 581a may be optionally formed from a relatively thicker metal layer than the underlying capacitor metal layers 2 through 6 in order to increase the inductor quality factor of inductor loop 581a while at the same time keeping the capacitor metal layers thin enough to allow closer capacitor electrode spacing and greater capacitance. Also illustrated in FIG. 10 is ground shield 900 that may be optionally present and coupled to circuit ground. While an exemplary embodiment is shown in FIG. 10, the ground shield might encompass slightly larger area than that of the capacitor metal traces in order to better shield the capacitor signal trace from the underlying substrate. In the illustrated embodiment, ground shield 900 is shown formed in metal layer 1 using similar processing as metal layers 2 through 7, although a ground shield may be alternatively formed in another type of conductive layer, such as a conductive doped polysilicon layer underlying metal layer 1, e.g., in which case the lowermost capacitor electrode layers may be formed in metal layer 1. As an example, in one embodiment the metal layer forming the inductor loop may be as thick as 3.5 micrometer while the underlying metal layers (metals 1-6) may be 150 nm thick. The polysilicon layer may be as thick as 80 nm. However, these dimensions are exemplary only, and that any suitable combination of greater or lesser layer thicknesses may be employed.

It will be understood that the embodiment of FIG. 10 is exemplary only, and that it is possible that a capacitor element 701 may be alternatively formed to have greater or less than five layers that are electrically coupled together by vias 995, and that configuration, location, and number of vias 995 may vary as needed or desired according to the characteristics of a given loop filter capacitor application.

FIG. 11 illustrates an overhead view of a semiconductor device layout 1100 of the electrically-coupled circuit components of a PLL frequency synthesizer circuit 400 according to one exemplary embodiment of the disclosed apparatus and methods. Loop filter capacitor segments 598 (labelled "Loop Filter" in FIG. 11) and surrounding VCO inductor loops 581a and 581b may be formed on a semiconductor substrate 930 (e.g., such as illustrated in FIG. 10), while certain components (e.g., transistors, gates etc. of circuits 436, 439, 442, 448, 451, 510 and 587, etc.) may be formed on a semiconductor substrate 930. It will be understood FIG. 11 is exemplary only, and that other device layout configurations are possible. It will also be understood that the disclosed PLL circuits may be combined with other circuitry, for example, combined with other circuitry within an integrated circuit, for example, such as described in U.S. patent application Ser. No. 15/179,847 filed Jun. 10, 2016, which is incorporated herein by reference in its entirety for all purposes.

It will be understood that one or more of the signal processing or data processing tasks, functions, or methodologies described herein for a receiver, transmitter, transceiver or frequency synthesizer may be implemented using one or more programmable integrated circuits (e.g., central processing units (CPUs), processors, controllers, microcontrollers, microprocessors, hardware accelerators, FPGAs (field programmable gate arrays), ASICs (application specific integrated circuits), and/or other programmable integrated circuits) that are programmed to perform the operations, tasks, functions, or actions described herein for the disclosed embodiments. For example, the one or more programmable integrated circuits can be configured to execute or otherwise be programmed with software, firmware, logic, and/or other program instructions stored in one or more non-transitory tangible computer-readable mediums (e.g., example, data storage devices, flash memories, random access memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For example, one or more of the tasks, functions, or methodologies described herein may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a programmable integrated circuit such as CPU, controller, microcontroller, microprocessor, ASIC, etc. or executed on a programmable logic device "PLD" such as FPGA, complex programmable logic device "CPLD", etc.) to perform one or more steps of the methodologies disclosed herein. In one embodiment, a group of such processors and PLDs may be programmable integrated circuits selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodology disclosed herein. It will also be understood that one or more steps of the present methodologies may be employed in one or more code segments of the computer program. For example, a code segment executed by the information handling system may include one or more steps of the disclosed methodologies.

Moreover, various circuit components described herein (e.g., LNA 120, LO 125, mixer 130, ADC 135, signal processing circuitry 140, data processing circuitry 155, signal source 433, PFD 436, charge pump (CP) 439, loop filter (LF) 442, VCO 445, divider 448, quadrature signal generator 451, multi-modulus divider 454, crystal oscillator 570, and other circuit components described and/or illustrated herein) may generally be implemented using digital, analog, or mixed-signal circuitry. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic or programmable integrated circuits), arithmetic logic units (ALUs), standard cells, custom cells, etc., as desired, and as persons of ordinary skill in the art will understand. In addition, analog circuitry or mixed-signal circuitry or both may be included, for instance, power converters, discrete devices (transistors, capacitors, resistors, inductors, diodes, etc.), and the like, as desired. The analog circuitry may include bias circuits, decoupling circuits, coupling circuits, supply circuits, current mirrors, current and/or voltage sources, filters, amplifiers, converters, signal processing circuits (e.g., multipliers), detectors, transducers, discrete components (transistors, diodes, resistors, capacitors, inductors), analog MUXs and the like, as desired, and as persons of ordinary skill in the art will understand. The mixed signal circuitry may include analog to digital converters (ADCs), digital to analog converters (DACs), etc.) in addition to analog circuitry and digital circuitry, as described above, and as persons of ordinary skill in the art will understand.

Further, while the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed apparatus and methods may be utilized in various combinations and/or independently. Thus the invention is not limited to only those combinations shown herein, but rather may include other combinations.

What is claimed is:

1. An apparatus having semiconductor device circuitry comprising:
   at least one loop filter coupled to provide a control signal based on a frequency of an input signal, the loop filter comprising at least one capacitor coupled between the control signal and ground of the circuitry; and
   a voltage controlled oscillator (VCO) comprising at least one inductor loop, the VCO being coupled to receive the control signal and to provide an output signal having a frequency that is a function of the control signal received from the loop filter;
   where the loop filter capacitor comprises at least one capacitor element that includes spaced capacitor electrodes configured as a magnetically differential capacitor circuit.

2. The apparatus of claim 1, where the spaced capacitor electrodes of the loop filter capacitor element are configured to create multiple component magnetic fields of opposite directions in response to the frequency of the input signal such that a composite magnetic field that results from the combination of the multiple component magnetic fields has a magnetic strength that is less than the magnetic strength of any of the component magnetic fields alone.

3. The apparatus of claim 1, where the spaced capacitor electrodes of the loop filter capacitor element are interdigitated capacitor fingers.

4. The apparatus of claim 1, where the spaced capacitor electrodes of the loop filter capacitor element have an axis of magnetically differential symmetry; and where the spaced capacitor electrodes of the loop filter capacitor element are configured to create opposing current dipole components on opposite sides of the axis of magnetically differential symmetry in response to the frequency of the input signal such that the magnetic fields created by the opposing current dipole components at least partially cancel each other out.

5. The apparatus of claim 1, where the loop filter capacitor comprises multiple capacitor elements that each includes spaced capacitor electrodes configured as a magnetically differential capacitor circuit.

6. The apparatus of claim 1, where the VCO inductor loop encloses a device area, and where at least a portion of the loop filter capacitor element is positioned within the device area enclosed by the VCO inductor loop.

7. The apparatus of claim 1, where the VCO inductor loop encloses a device area, and where the entire loop filter capacitor element is positioned within the device area enclosed by the VCO inductor loop.

8. The apparatus of claim 1, where the apparatus comprises phase locked loop (PLL) circuitry; and where the loop filter and VCO are components of the phase locked loop (PLL) circuitry.

9. The apparatus of claim 8, where the apparatus is an RF apparatus that comprises an integrated circuit that includes the phase locked loop (PLL) circuitry.

10. A semiconductor circuit device, comprising:
   a semiconductor substrate;
   at least one capacitor element formed in one or more conductive layers on the semiconductor substrate, each of the conducive layers being separated from any other conductive layers by a layer of dielectric material, and the capacitor element including spaced capacitor electrodes configured in the conductive layers as a magnetically differential capacitor circuit; and
   at least one conductive inductor loop formed in a different conductive layer on the semiconductor substrate that is separated from the conductive layers of the capacitor element by a layer of dielectric material, the inductor loop enclosing a device area of the semiconductor device;
   where at least a portion of the capacitor element is positioned within the device area enclosed by the inductor loop.

11. The device of claim 10, where the entire capacitor element is positioned within the device area enclosed by the inductor loop.

12. The device of claim 10, where the at least one capacitor element comprises multiple capacitor elements coupled together, the multiple capacitor elements being entirely enclosed within the device area enclosed by the inductor loop.

13. The device of claim 10, where the at least one capacitor element is formed in multiple conductive layers on the semiconductor substrate that are coupled together by conductive vias.

14. The device of claim 10, further comprising a ground shield formed in a conductive layer between the semiconductor substrate and the conductive layers of the capacitor element.

15. The device of claim 10, where the spaced capacitor electrodes are interdigitated capacitor fingers separated from each other by dielectric material.

16. A method, comprising:
   using at least one loop filter to provide a control signal based on a frequency of an input signal, the loop filter comprising at least one capacitor coupled between the control signal and ground of the circuitry; and
   using a voltage controlled oscillator (VCO) to receive the control signal and to provide an output signal having a frequency that is a function of the control signal received from the loop filter;
   where the loop filter capacitor comprises at least one capacitor element that includes spaced capacitor electrodes configured as a magnetically differential capacitor circuit.

17. The method of claim 16, further comprising providing the input signal to the loop filter to cause the spaced capacitor electrodes of the loop filter capacitor element to create multiple component magnetic fields of opposite directions that combine to form a composite magnetic field that has a magnetic strength that is less than the magnetic strength of any of the component magnetic fields alone.

18. The method of claim 16, where the spaced capacitor electrodes of the loop filter capacitor element are interdigitated capacitor fingers.

19. The method of claim 16, where the spaced capacitor electrodes of the loop filter capacitor element have an axis of magnetically differential symmetry; and where the method further comprises providing the input signal to the loop filter to cause the spaced capacitor electrodes of the loop filter capacitor element to create opposing current dipole components on opposite sides of the axis of magnetically differential symmetry in response to the frequency of the input signal such that the magnetic fields created by the opposing current dipole components at least partially cancel each other out.

20. The method of claim 16, where the loop filter capacitor comprises multiple capacitor elements that each includes spaced capacitor electrodes configured as a magnetically differential capacitor circuit.

21. The method of claim 16, where the VCO inductor loop encloses a device area, and where at least a portion of the loop filter capacitor element is positioned within the device area enclosed by the VCO inductor loop.

22. The method of claim 16, where the VCO inductor loop encloses a device area, and where the entire loop filter capacitor element is positioned within the device area enclosed by the VCO inductor loop.

23. The method of claim 16, where the loop filter and VCO are components of a phase locked loop (PLL) circuit; and where the method further comprises providing the VCO output signal to drive a divider to drive a signal generator of the PLL circuit.

24. The method of claim 23, where the apparatus is an RF apparatus that comprises an integrated circuit that includes the phase locked loop (PLL) circuitry.

* * * * *